(12) United States Patent
Uejima et al.

(10) Patent No.: US 10,879,271 B2
(45) Date of Patent: Dec. 29, 2020

(54) SEMICONDUCTOR DEVICE

(71) Applicant: RENESAS ELECTRONICS CORPORATION, Tokyo (JP)

(72) Inventors: Kazuya Uejima, Tokyo (JP); Kazuhiro Koudate, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 96 days.

(21) Appl. No.: 16/361,878

(22) Filed: Mar. 22, 2019

(65) Prior Publication Data
US 2019/0319047 A1 Oct. 17, 2019

(30) Foreign Application Priority Data

Apr. 13, 2018 (JP) ................................. 2018-077375

(51) Int. Cl.
| | |
|---|---|
| H01L 27/12 | (2006.01) |
| H03K 3/012 | (2006.01) |
| H03K 3/356 | (2006.01) |
| H03K 19/00 | (2006.01) |
| H03K 19/0185 | (2006.01) |

(52) U.S. Cl.
CPC ......... *H01L 27/1207* (2013.01); *H03K 3/012* (2013.01); *H03K 3/35613* (2013.01); *H03K 19/0013* (2013.01); *H03K 19/018528* (2013.01)

(58) Field of Classification Search
CPC ............... H03K 3/012; H03K 3/35613; H03K 19/0013; H03K 19/018528; H01L 27/1207
See application file for complete search history.

(56) References Cited

U.S. PATENT DOCUMENTS

| | | | |
|---|---|---|---|
| 9,443,934 B2 * | 9/2016 | Kobayashi | .......... H01L 29/1033 |
| 2008/0258771 A1 * | 10/2008 | Tachibana | ........... H01L 27/0921 |
| | | | 326/98 |
| 2010/0060338 A1 | 3/2010 | Fong et al. | |
| 2012/0086495 A1 * | 4/2012 | Chen | ................ H03K 3/356165 |
| | | | 327/333 |
| 2015/0171222 A1 * | 6/2015 | Sasagawa | ............... H01L 29/24 |
| | | | 257/43 |
| 2019/0319047 A1 * | 10/2019 | Uejima | ............ H03K 3/356165 |

* cited by examiner

*Primary Examiner* — John W Poos
(74) *Attorney, Agent, or Firm* — McDermott Will & Emery LLP

(57) ABSTRACT

Reduction in power consumption of a semiconductor device is achieved. The semiconductor device includes: a first circuit operating at a first power supply voltage and a second circuit operating at a second power supply voltage and including a level shift unit and a switch unit, the first circuit is configured of a low-breakdown-voltage n-type transistor that is an SOTB transistor, and the switch unit is configured of an n-type transistor that is an SOTB transistor. A second power supply voltage is higher than a first power supply voltage, and an impurity concentration of a channel formation region of the n-type transistor is higher than an impurity concentration of a channel formation region of the low-breakdown-voltage n-type transistor.

20 Claims, 9 Drawing Sheets

SEMICONDUCTOR DEVICE

CROSS-REFERENCE TO RELATED APPLICATION

The present application claims priority from Japanese Patent Application No. 2018-77375 filed on Apr. 13, 2018, the content of which is hereby incorporated by reference into this application.

TECHNICAL FIELD OF THE INVENTION

The present invention relates to a semiconductor device. For example, the present invention relates to a technique effectively applied to a semiconductor device including a level shifter configured by using a field effect transistor formed in an SOI (Silicon On Insulator) substrate.

BACKGROUND OF THE INVENTION

Figure 3:
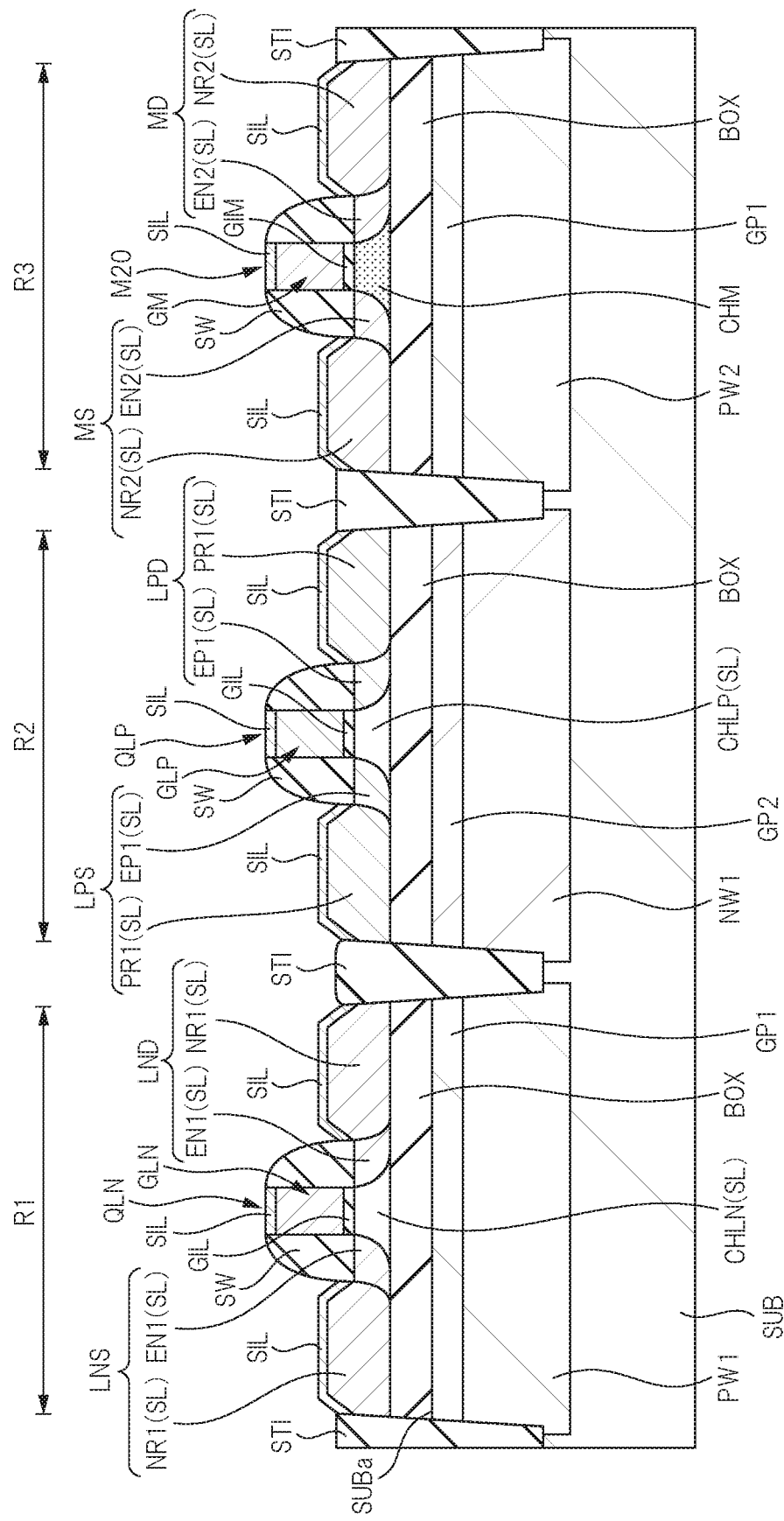

U.S. Patent Application Laid-open Publication No. 2010/0060338 (Patent Document 1), FIG. 3, discloses a level shifter 300 configured of a level shift unit 305 and a transistor M26 connected in series to the level shift unit 305. Since the transistor M26 is formed, a leakage current and power consumption of the level shifter 300 are reduced.

SUMMARY OF THE INVENTION

For example, in order to reduce the power consumption of the semiconductor device, it is effective to reduce a driving voltage of the field effect transistor configuring the semiconductor device. In order to reduce the driving voltage of the field effect transistor, it is known that it is effective to use a so-called "thin-type BOX-SOI (SOTB: Silicon On Thin Buried oxide) technique". The field effect transistor formed by using the "thin-type BOX-SOI technique" is called "SOTB transistor".

The inventors of the present invention have studied a semiconductor device having a low-voltage circuit and a high-voltage circuit embedded inside a semiconductor chip. In such a semiconductor device, it is required to transfer a signal from the low-voltage circuit to the high-voltage circuit through a level shifter. Each of the low-voltage circuit and the level shifter is configured of the SOTB transistor.

According to the inventors of the present invention, it has been found out that a leakage current occurs in the level shifter configured of the SOTB transistor so that the reduction in the power consumption of the semiconductor device is inhibited.

Other objects and novel characteristics will be apparent from the description of the present specification and the accompanying drawings.

A semiconductor device according to one embodiment has a first circuit operating at a first power supply voltage and a second circuit operating at a second power supply voltage and including a level shift unit and a switch unit, the first circuit is configured of a low-breakdown-voltage n-type transistor that is an SOTB transistor, and the switch unit is configured of an n-type transistor that is an SOTB transistor. The second power supply voltage is higher than the first power supply voltage, and an impurity concentration of a channel formation region of the n-type transistor is higher than an impurity concentration of a channel formation region of the low-breakdown-voltage n-type transistor.

According to one embodiment, the reduction in the power consumption of the semiconductor device can be achieved.

BRIEF DESCRIPTIONS OF THE DRAWINGS

Figure 1:
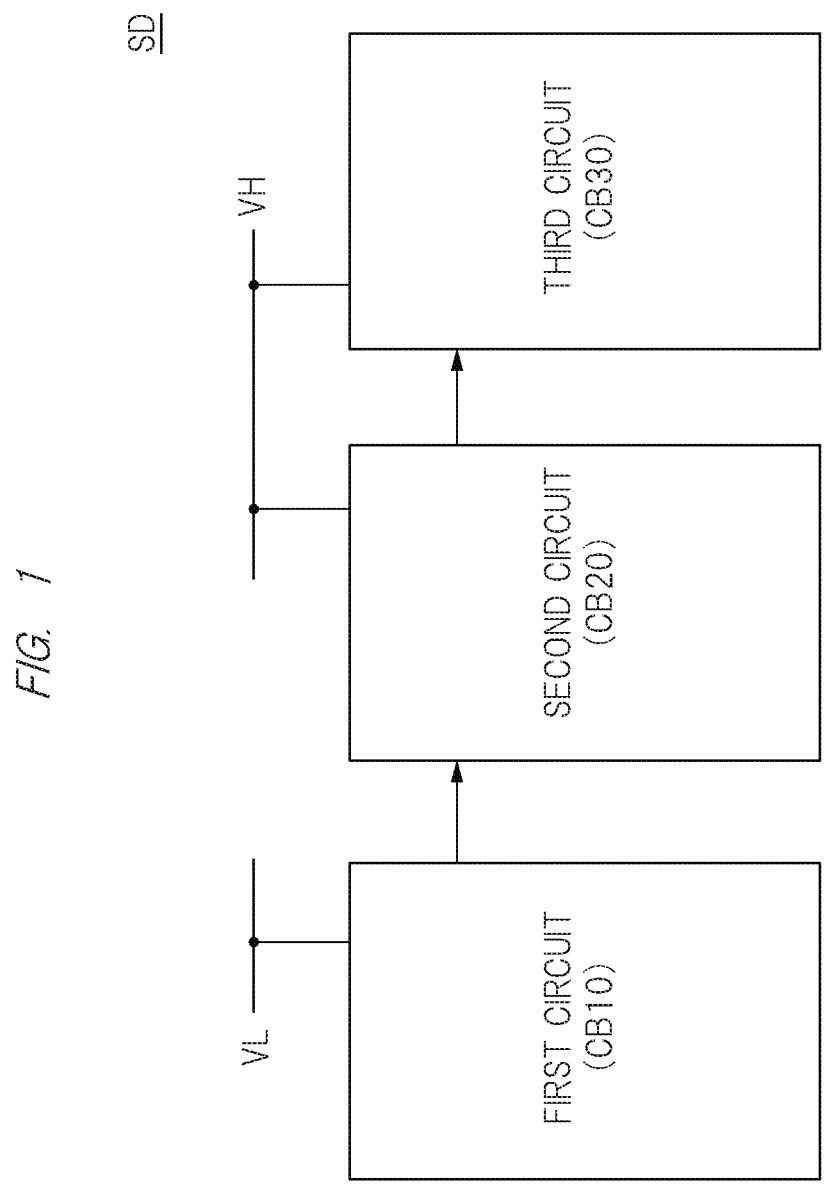
Figure 2:
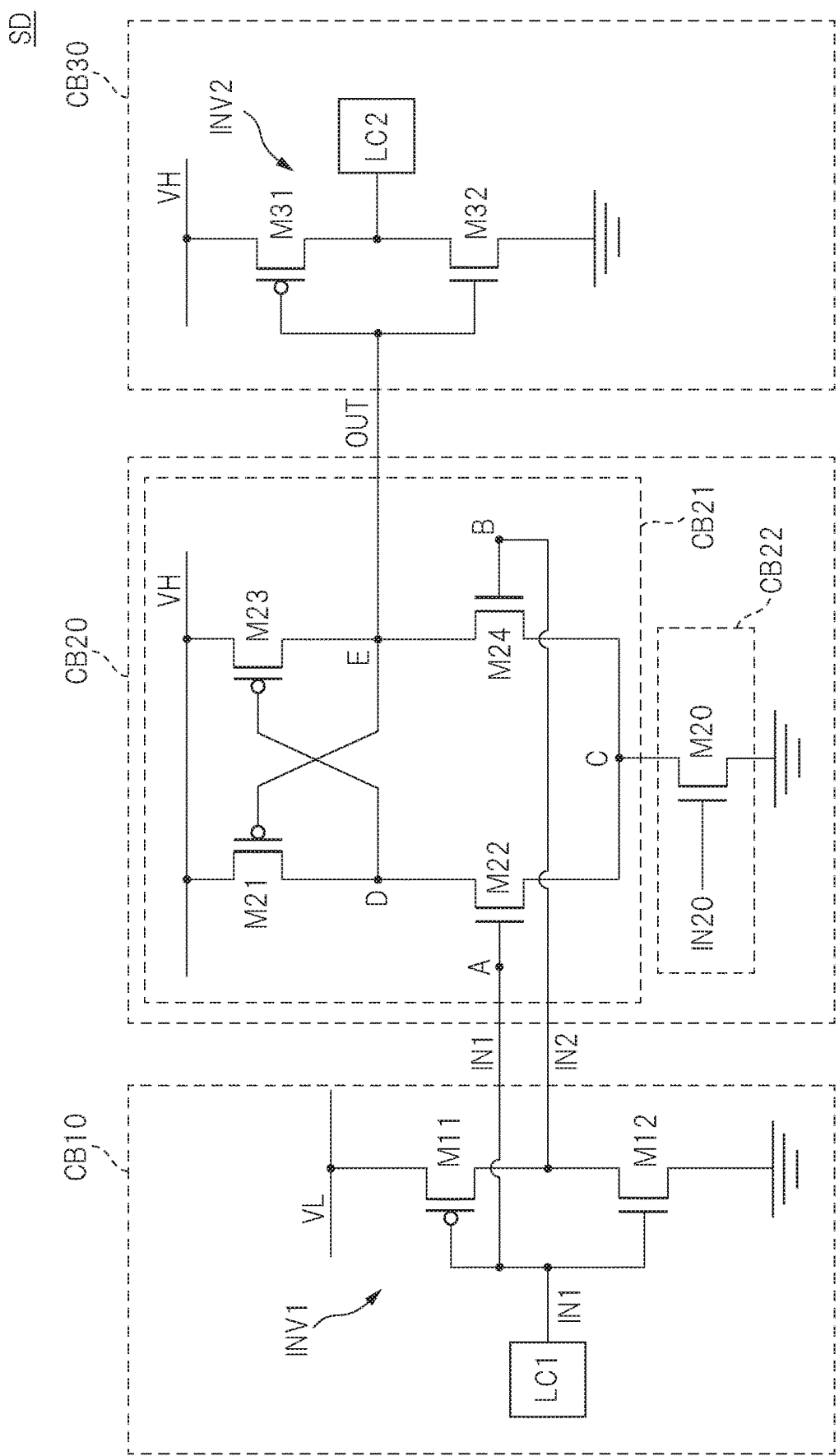
Figure 4:
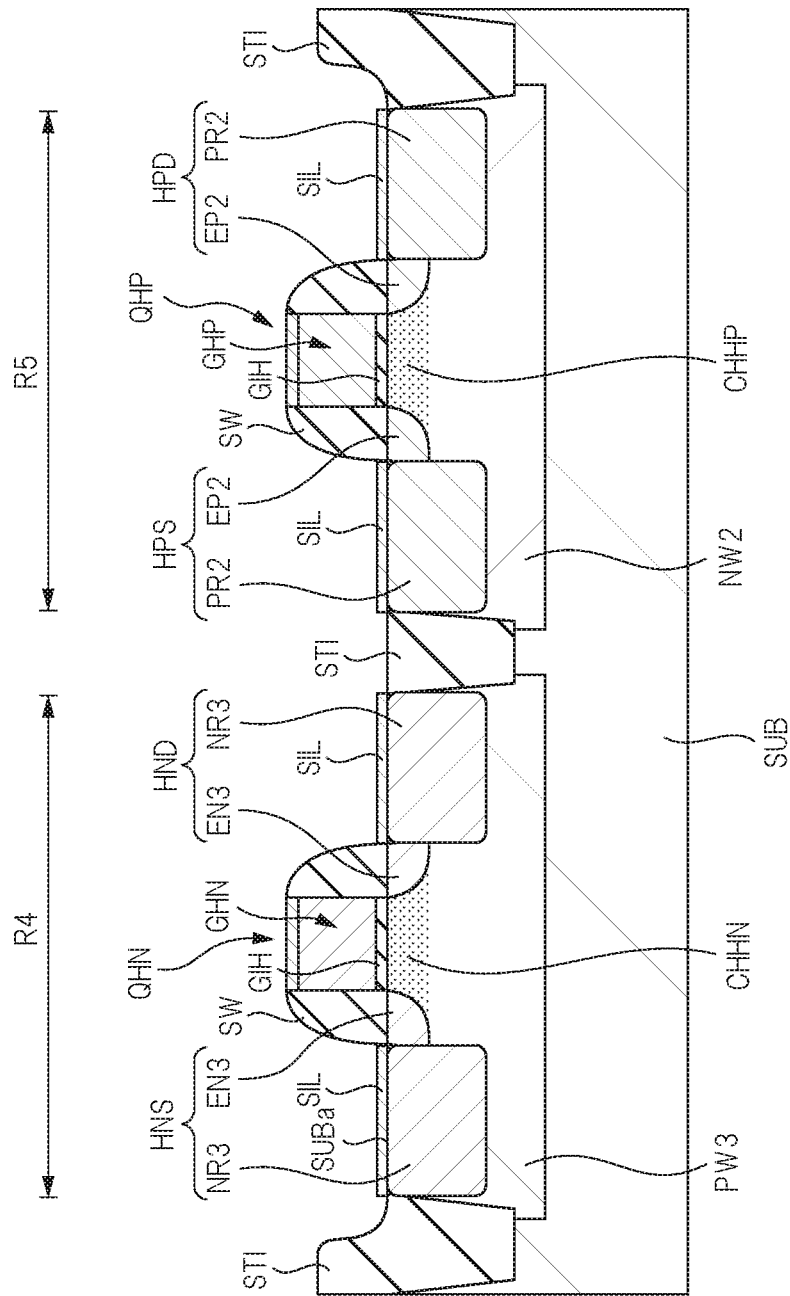
Figure 5:
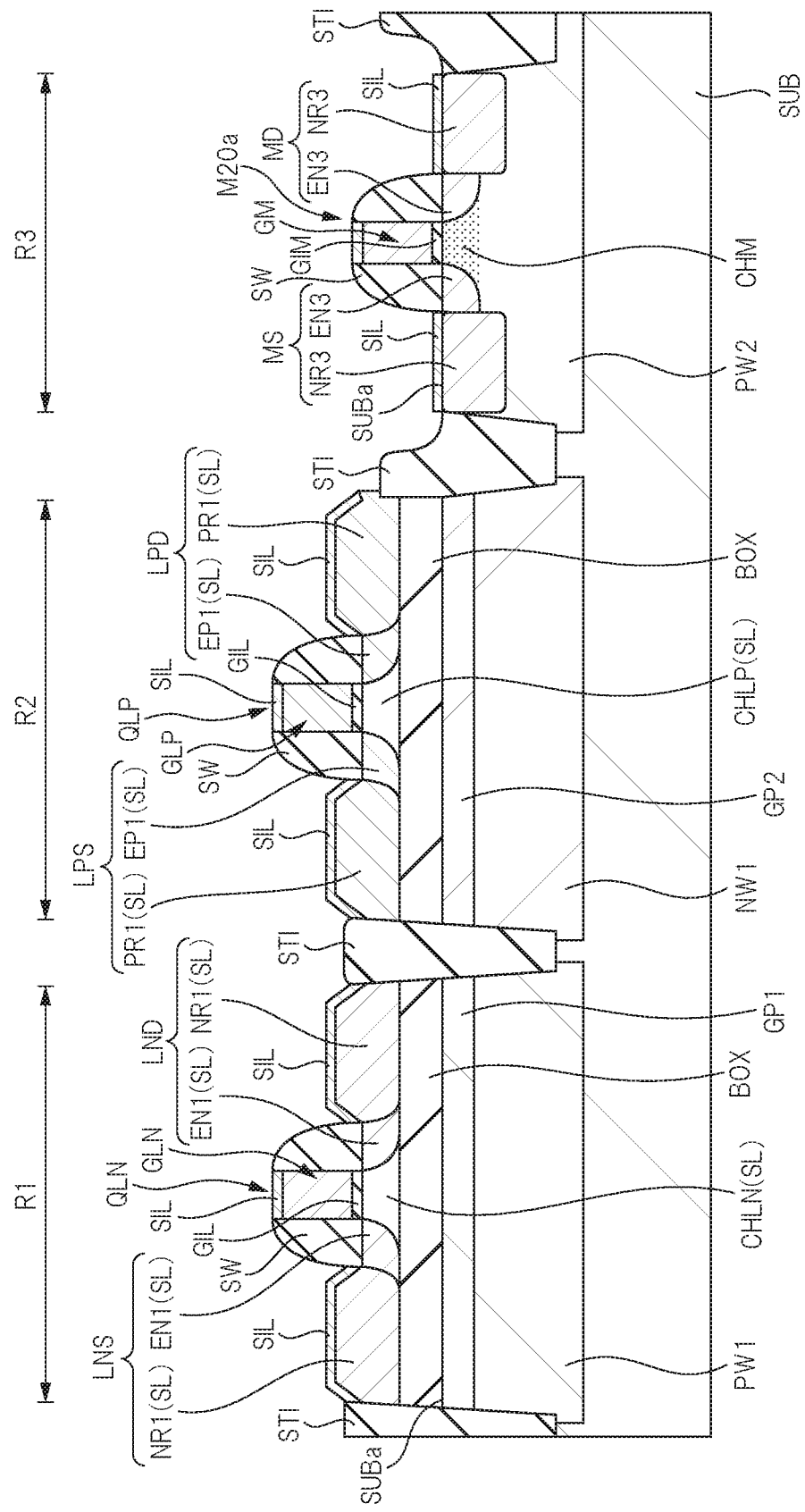
Figure 6:
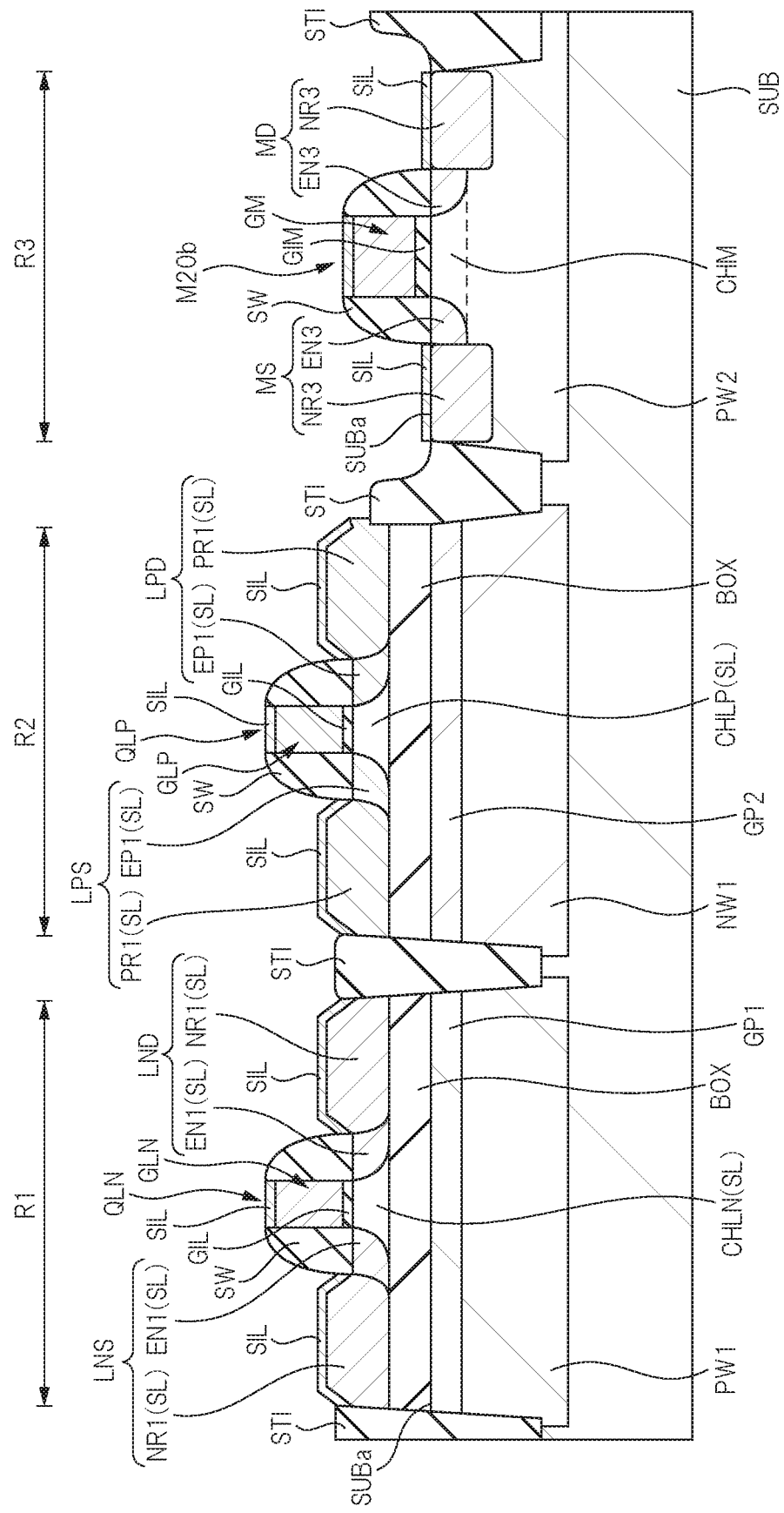
Figure 7:
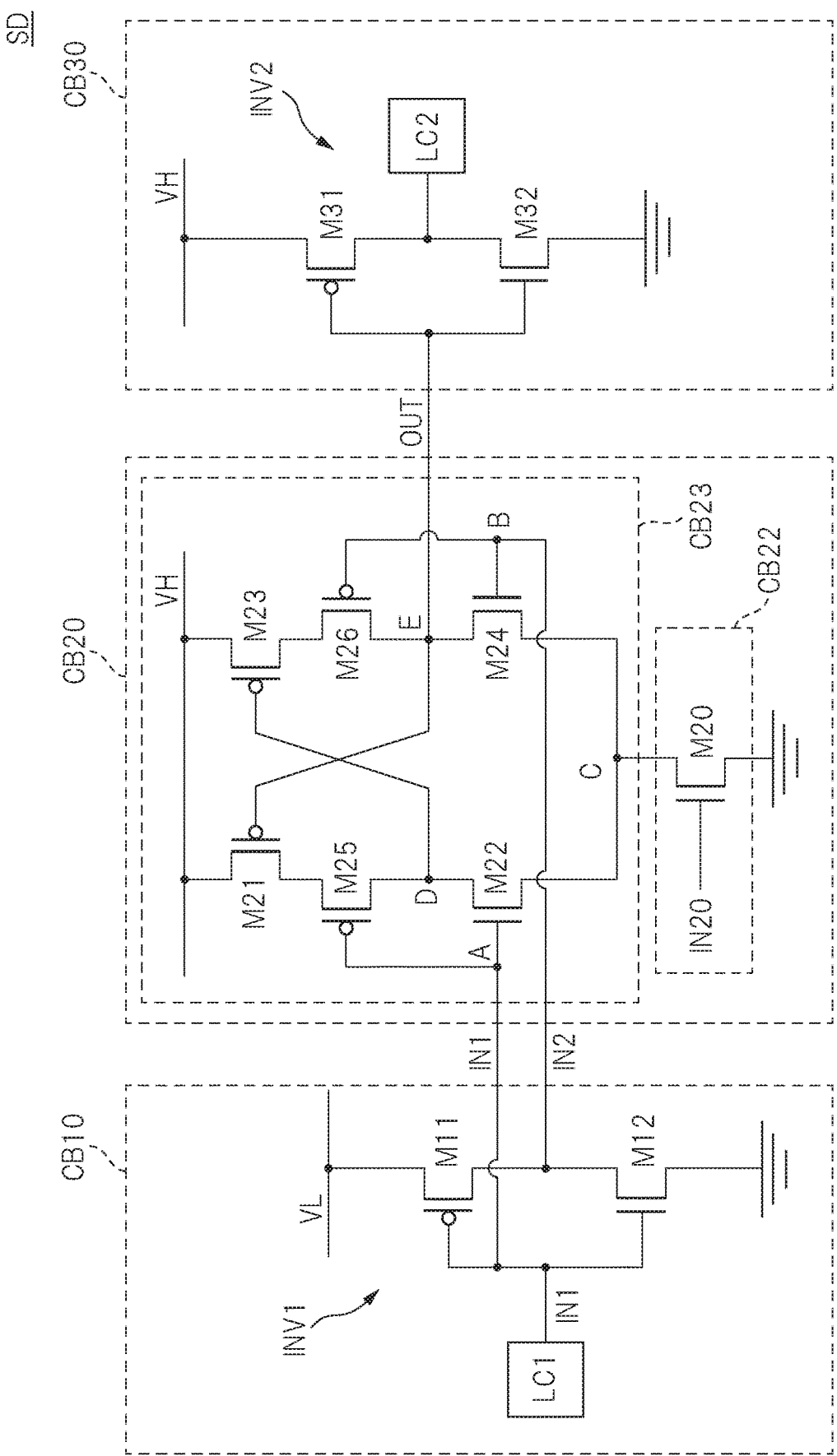
Figure 8:
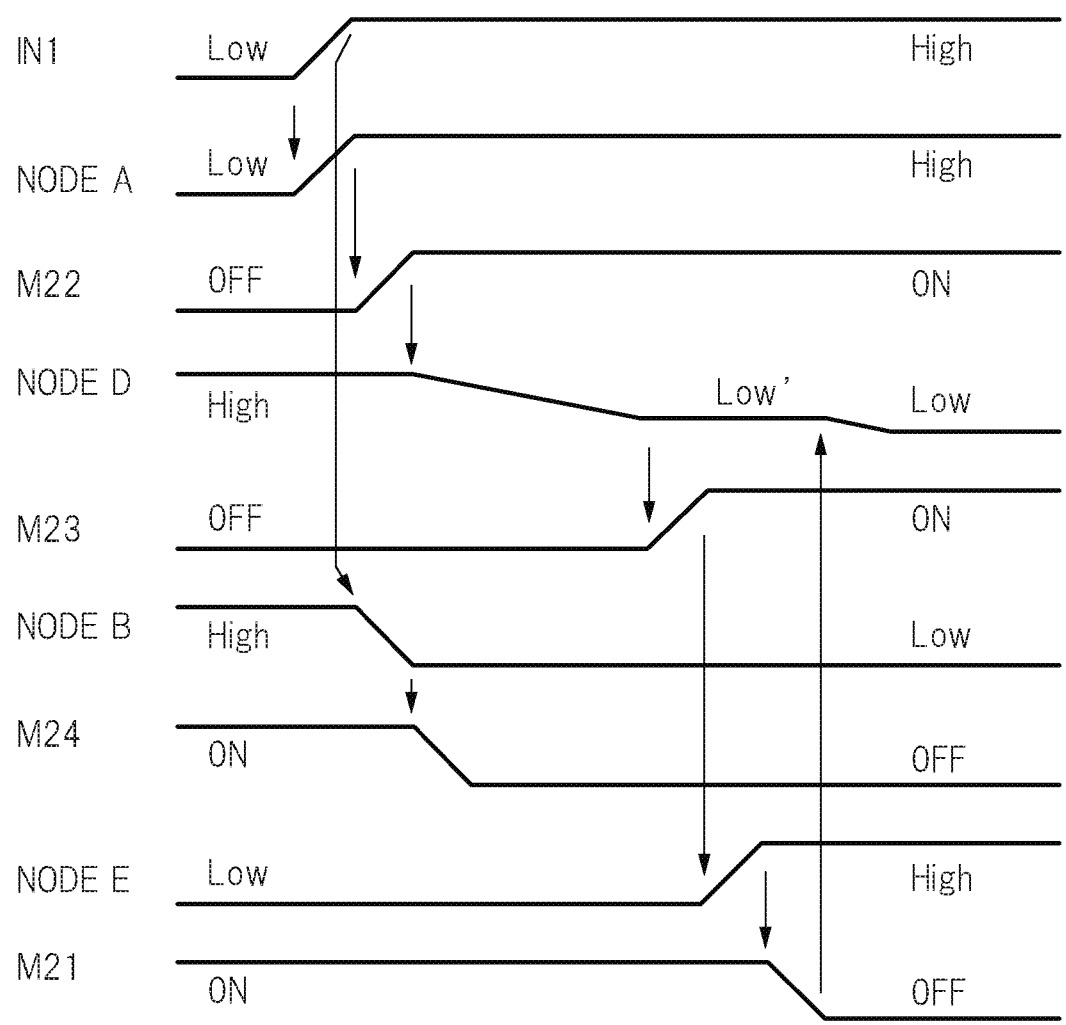
Figure 9:
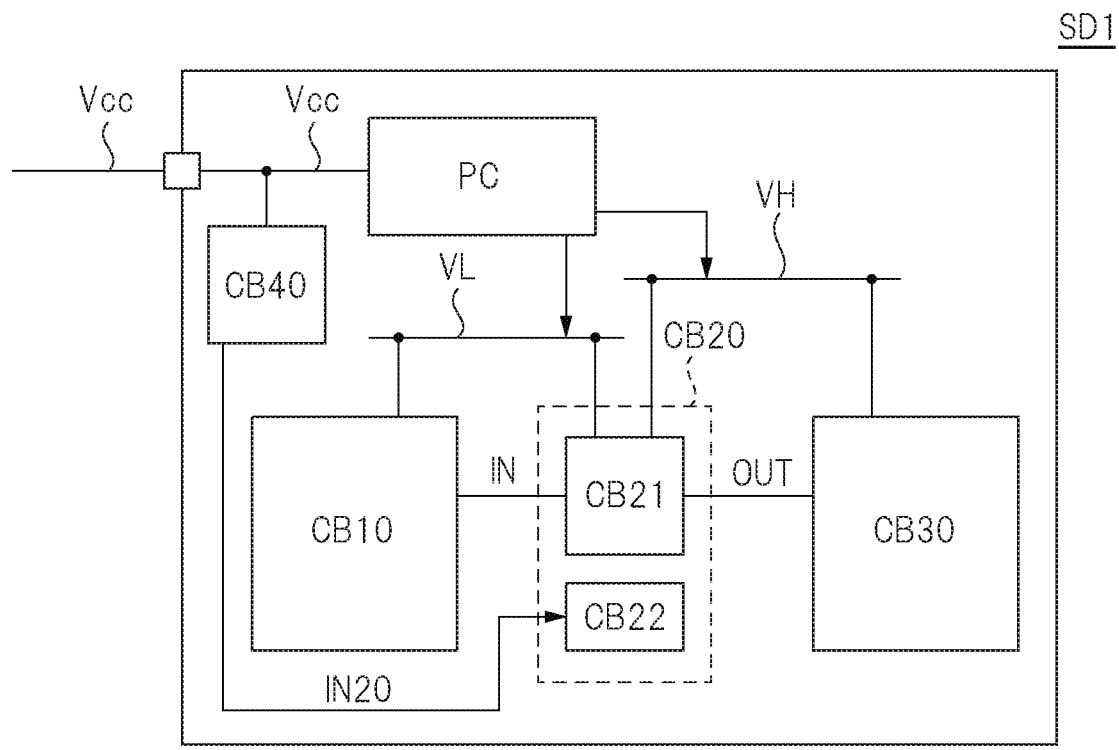
Figure 10:
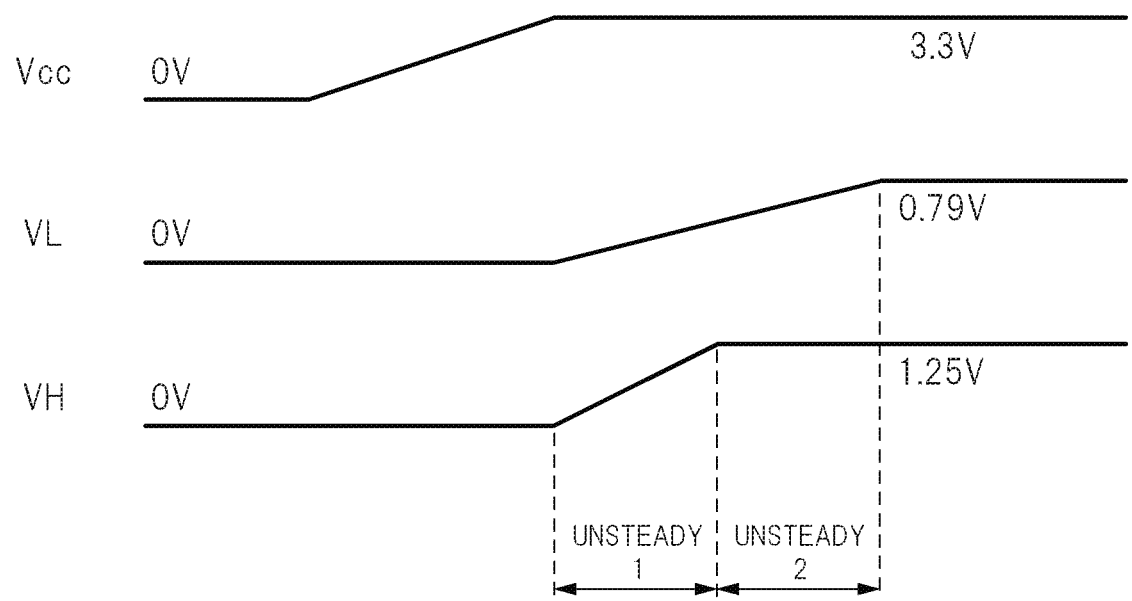

FIG. 1 is a block diagram of a semiconductor device;
FIG. 2 is an equivalent circuit diagram of the semiconductor device;
FIG. 3 is a cross-sectional view showing a device structure of a semiconductor device according to a first embodiment;
FIG. 4 is a cross-sectional view showing a device structure of the semiconductor device according to the first embodiment;
FIG. 5 is a cross-sectional view showing a device structure of a semiconductor device according to a first modification example of the first embodiment;
FIG. 6 is a cross-sectional view showing a device structure of a semiconductor device according to a second modification example of the first embodiment;
FIG. 7 is an equivalent circuit diagram of a semiconductor device according to a third modification example of the first embodiment;
FIG. 8 is a time chart of the equivalent circuit diagram shown in FIG. 2, according to a second comparative example;
FIG. 9 is a block diagram of a semiconductor device according to a second embodiment; and
FIG. 10 is a diagram showing a rising sequence of a power supply voltage in the semiconductor device according to the second embodiment.

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, the same components are denoted by the same reference symbols in principle throughout all the drawings for describing the embodiments, and the repetitive description thereof is omitted. Note that hatching is used even in a plan view so as to make the drawings easy to see.

First Embodiment

FIG. 1 is a block diagram of a semiconductor device, and FIG. 2 is an equivalent circuit diagram of the semiconductor device. Note that FIGS. 1 and 2 show a block diagram and an equivalent circuit diagram of a part of the semiconductor device.

As shown in FIG. 1, a semiconductor device SD has a first circuit (first circuit block) CB10 that is a low-voltage circuit, a third circuit (third circuit block) CB30 that is a high-voltage circuit, and a second circuit (second circuit block) CB20 that is an interface circuit. The first circuit CB10 is connected to a first power supply line VL, and operates at a first power supply voltage. Each of the second circuit CB20 and the third circuit CB30 is connected to a second power supply line VH, and operates at a second power supply voltage that is higher than the first power supply voltage. The first power supply voltage is applied to the first power supply line VL, and the second power supply voltage that is higher than the first power supply voltage is applied to the second power supply line VH. The second circuit CB20 is a level shifter that converts a signal with a first power supply voltage level input from the first circuit CB10 into a signal with a second power supply voltage level, and that outputs the signal to the third circuit CB30. For example, the first power supply voltage is 0.79 V, and the second power supply voltage is 1.25 V.

As shown in FIG. 2, in the first circuit CB10, for example, an inverter INV1 that is a logic circuit is formed. In the first circuit CB10, not only the inverter INV1 but also a logic circuit LC1 are included. In the second circuit CB20, a level shifter including a level shift unit CB21 and a switch unit CB22 is formed. In the third circuit CB30, for example, an inverter INV2 that is a logic circuit is formed. In the third circuit CB30, not only the inverter INV2 but also a logic circuit LC2 are included.

In the first circuit CB10, the inverter INV1 is connected between the first power supply line VL and a ground line. The inverter INV1 is configured of a p-type transistor M11 and an n-type transistor M12 that are connected in series. The inverter INV1 receives a signal IN1 from the logic circuit LC1 inside the first circuit CB10, and outputs a converted signal IN2 to the level shift unit CB21 of the second circuit CB20. The signal IN1 is input to the level shift unit CB21 so as not to pass through the inverter INV1. The signal IN1 is input to a gate of an n-type transistor M22 described later, and the signal IN2 is input to a gate of an n-type transistor M24 described later. Two inputs of the level shift unit CB21 described later are shown as a node A and a node B.

In the second circuit CB20, the level shifter including the level shift unit CB21 and the switch unit CB22 is formed. A connecting portion between the level shift unit CB21 and the switch unit CB22 is shown as a node C. The level shift unit CB21 has p-type transistors M21 and M23 and n-type transistors M22 and M24 to form a level shift circuit (logic circuit). Between the second power supply line VH and the node C, the p-type transistor M21 and the n-type transistor M22 that are connected in series and the p-type transistor M23 and the n-type transistor M24 that are connected in series are connected to each other in parallel to each other. In other words, between the second power supply line VH and the node C, a first circuit in which a source/drain path of the p-type transistor M21 and a source/drain path of the n-type transistor M22 are connected in series to each other and a second circuit in which a source/drain path of the p-type transistor M23 and a source/drain path of the n-type transistor M24 are connected in series to each other are connected in parallel to each other. A connecting portion between the source/drain path of the p-type transistor M21 and the source/drain path of the n-type transistor M22 is shown as a node D, and a connecting portion between the source/drain path of the p-type transistor M23 and the source/drain path of the n-type transistor M24 is shown as a node E. A gate of the p-type transistor M21 is connected to the node E, and a gate of the p-type transistor M23 is connected to the node D. From the node E, a signal OUT is output to the third circuit CB30. The switch unit CB22 has an n-type transistor M20 that is a switch element. The n-type transistor M20 of the switch unit CB22 is connected between the node C and the ground line. To a gate of the n-type transistor M20, a signal IN20 is input from a logic circuit inside the third circuit CB30 although not illustrated. Between the second power supply line VH and the ground line in the second circuit CB20, the level shift circuit (logic circuit) and the switch element are connected in series to each other.

Between the second power supply line VH and a ground line in the third circuit CB30, the inverter INV2 is connected. The inverter INV2 is configured of a p-type transistor M31 and an n-type transistor M32 that are connected in series. The inverter INV2 receives the signal OUT from the level shift unit CB21, and outputs a converted signal to the logic circuit LC2 inside the third circuit CB30.

Next, a device structure of an element (transistor) configuring a semiconductor device will be explained. Each of FIGS. 3 and 4 is a cross-sectional view showing a device structure of a semiconductor device according to a first embodiment.

FIG. 3 shows a cross-sectional structure of each of a low-breakdown-voltage n-type transistor QLN, a low-breakdown-voltage p-type transistor QLP and an n-type transistor M20. A region R1 is a formation region for the low-breakdown-voltage n-type transistor QLN, a region R2 is a formation region for the low-breakdown-voltage p-type transistor QLP, and a region R3 is a formation region for the n-type transistor M20. FIG. 4 shows a cross-sectional structure of each of a high-breakdown-voltage n-type transistor QHN and a high-breakdown-voltage p-type transistor QHP. A region R4 is a formation region for the high-breakdown-voltage n-type transistor QHN, and a region R5 is a formation region for the high-breakdown-voltage p-type transistor QHP.

Each of the first circuit CB10 and the level shift unit CB21 of the second circuit CB20 shown in FIG. 2 is configured of the low-breakdown-voltage n-type transistor QLN and the low-breakdown-voltage p-type transistor QLP, the third circuit CB30 is configured of the high-breakdown-voltage n-type transistor QHN and the high-breakdown-voltage p-type transistor QHP, and the switch unit CB22 of the second circuit CB20 is configured of the n-type transistor M20. That is, each of the n-type transistors M12, M22 and M24 in FIG. 2 is configured of the low-breakdown-voltage n-type transistor QLN, and each of the p-type transistors M11, M21 and M23 therein is configured of the low-breakdown-voltage p-type transistor QLP. Similarly, the logic circuit LC1 inside the first circuit CB10 is also configured of the low-breakdown-voltage n-type transistor QLN and the low-breakdown-voltage p-type transistor QLP. The n-type transistor M32 in the third circuit CB30 is configured of the high-breakdown-voltage n-type transistor QHN, and the p-type transistor M31 therein is configured of the high-breakdown-voltage p-type transistor QHP. Similarly, the logic circuit LC2 inside the third circuit CB30 is also configured of the high-breakdown-voltage n-type transistor QHN and the high-breakdown-voltage p-type transistor QHP.

First, a device structure of the low-breakdown-voltage n-type transistor QLN will be explained. In FIG. 3, an element isolating film STI is formed in an SOI substrate configured of a support substrate SUB, a buried insulating layer BOX and a semiconductor layer SL. The low-breakdown-voltage n-type transistor QLN is formed in the region R1 sectioned by this element isolating film STI.

The low-breakdown-voltage n-type transistor QLN has an n-type gate electrode GLN, a gate insulating film GIL, an n-type source region LNS, an n-type drain region LND and a channel formation region CHLN.

The source region LNS, the drain region LND and the channel formation region CHLN are formed inside the semiconductor layer SL positioned over the buried insulating layer BOX, and the source region LNS and the drain region LND are arranged on both ends of the gate electrode GLN so as to sandwich the gate electrode GLN therebetween. The channel formation region CHLN is formed between the source region LNS and the drain region LND, and the gate electrode GLN is arranged over the channel formation region CHLN through the gate insulating film GIL. Each of the source region LNS and the drain region LND includes an n-type extension region EN1 and an n-type semiconductor region NR1. The extension region EN1 is positioned between the semiconductor region NR1 and the channel formation region CHLN, and is positioned under a sidewall spacer (sidewall insulating film) SW formed over a sidewall of the gate electrode GLN. A silicide layer SIL is formed in a surface of the semiconductor region NR1 and a surface of the gate electrode GLN.

In the region R1, a p-type well region PW1 is formed in a main surface SUBa of the p-type support substrate SUB. Further, inside the p-type well region PW1, a p-type ground plane region (semiconductor region) GP1 is formed so as to be in contact with the buried insulating layer BOX. An impurity concentration of the ground plane region GP1 is higher than an impurity concentration of the p-type well region PW1, and the impurity concentration of p-type well region PW1 is higher than an impurity concentration of the support substrate SUB.

The low-breakdown-voltage n-type transistor QLN is a fully-depleted SOTB transistor. Its gate length is, for example, 60 nm. The gate length means a length of the gate electrode GLN in a direction in which the source region LNS and the drain region LND are connected to each other. A thickness of the buried insulating layer BOX is 10 to 20 nm, a thickness of the semiconductor layer SL is 5 to 20 nm, a thickness of the gate insulating film GIL is 2 to 3 nm, and an impurity concentration of the channel formation region CHLN is equal to or smaller than $3\times10^{17}$ cm$^{-3}$. Here, a channel whose impurity concentration is equal to or smaller than $3\times10^{17}$ cm$^{-3}$ is referred to as non-doped channel for convenience. Note that the impurity of the channel formation region CHLN means a p-type impurity or an n-type impurity, and the p-type impurity includes boron (B) or others while the n-type impurity includes phosphorus (P), arsenic (As) or others. Note that the SOTB transistor means an SOI transistor having a thickness of the buried insulating layer BOX and a thickness of the semiconductor layer each of which is equal to or smaller than 20 nm.

For the low-breakdown-voltage n-type transistor QLN, in order to adjust a threshold voltage, the doped channel technique that is ion implantation of an impurity such as boron (B) to the channel formation region CHLN is not used. This is because the technique causes large variation in the threshold voltage so that it is difficult to control the threshold voltage. That is, for the low-breakdown-voltage n-type transistor QLN, the non-doped channel technique is used. Therefore, in the present embodiment, in order to increase the threshold voltage of the low-breakdown-voltage n-type transistor QLN, the p-type ground plane region GP1 is arranged immediately under the buried insulating layer BOX. However, the p-type ground plane region GP1 is not always necessary. And, in order to increase the threshold voltage, a back bias technique that is application of a voltage with a negative potential to the p-type well region PW1 may be used.

That is, as the n-type transistor configuring the first circuit CB10, a transistor with the p-type ground plane region GP1, a transistor without the p-type ground plane region GP1, or a transistor for which the back bias technique has been used may be mixed. Here, it is effective to reduce the impurity concentration of the channel formation region CHLN when the threshold voltage is adjusted by the ground plane region GP1 or the back bias technique (in other words, effective to reduce the impurity concentration to be equal to or smaller than $3\times10^{17}$ cm$^{-3}$).

It is preferable to form the n-type transistor configuring the second circuit CB20 from the transistor with the p-type ground plane region GP1 or the transistor without the p-type ground plane region GP1, and not preferable to form it from the transistor for which the back bias technique has been used. In the transistor for which the back bias technique has been used, it is required to form a power feed region for supplying a voltage with a negative potential to the p-type well region PW1, and this is because an area of the formation region for the second circuit CB20 increases.

Next, a device structure of the low-breakdown-voltage p-type transistor QLP will be explained. In FIG. 3, an element isolating film STI is formed in an SOI substrate formed of a support substrate SUB, a buried insulating layer BOX and a semiconductor layer SL. The low-breakdown-voltage p-type transistor QLP is formed in the region R2 sectioned by this element isolating film STI.

The low-breakdown-voltage p-type transistor QLP has a p-type gate electrode GLP, a gate insulating film GIL, a p-type source region LPS, a p-type drain region LPD and a channel formation region CHLP.

The source region LPS, the drain region LPD and the channel formation region CHLP are formed inside the semiconductor layer SL positioned over the buried insulating layer BOX, and the source region LPS and the drain region LPD are arranged on both ends of the gate electrode GLP across the gate electrode GLP. The channel formation region CHLP is formed between the source region LPS and the drain region LPD, and the gate electrode GLP is arranged over the channel formation region CHLP through the gate insulating film GIL. Each of the source region LPS and the drain region LPD includes a p-type extension region EP1 and a p-type semiconductor region PR1. The extension region EP1 is positioned between the semiconductor region PR1 and the channel formation region CHLP, and is positioned under a sidewall spacer (sidewall insulating film) SW formed over a sidewall of the gate electrode GLP. A silicide layer SIL is formed in a surface of the semiconductor region PR1 and a surface of the gate electrode GLP.

In the region R2, an n-type well region NW1 is formed in a main surface SUBa of the p-type support substrate SUB. Further, inside the n-type well region NW1, an n-type ground plane region (semiconductor region) GP2 is formed so as to be in contact with the buried insulating layer BOX. An impurity concentration of the ground plane region GP2 is higher than that of the n-type well region NW1.

The low-breakdown-voltage p-type transistor QLP is a fully-depleted SOTB transistor. Its gate length is, for example, 60 nm. The gate length means a length of the gate electrode GLP in a direction in which the source region LPS and the drain region LPD are connected to each other. A thickness of the buried insulating layer BOX is 10 to 20 nm, a thickness of the semiconductor layer SL is 8 to 12 nm, a thickness of the gate insulating film GIL is 2 to 3 nm, and an impurity concentration of the channel formation region CHLP is equal to or smaller than $3 \times 10^{17}$ cm$^{-3}$. Here, a chanel whose impurity concentration is equal to or smaller than $3 \times 10^{17}$ cm$^{-3}$ is referred to as non-doped channel for convenience. Note that the impurity of the channel formation region CHLP means boron (B) or others that is a p-type impurity or phosphorus (P), arsenic (As) or others that is an n-type impurity.

The thickness of the gate insulating film GIL of the low-breakdown-voltage p-type transistor QLP and the thickness of the gate insulating film GIL of the low-breakdown-voltage n-type transistor QLN are equal to each other. And, the thickness of the semiconductor layer SL of the low-breakdown-voltage p-type transistor QLP and the thickness of the semiconductor layer SL of the low-breakdown-voltage n-type transistor QLN are equal to each other.

For the low-breakdown-voltage p-type transistor QLP, in order to adjust a threshold voltage, the doped channel technique that is ion implantation of the impurity such as phosphorus (P) to the channel formation region CHLP is not used. This is because the technique causes the large variation in the threshold voltage so that it is difficult to control the threshold voltage. That is, for the low-breakdown-voltage p-type transistor QLP, the non-doped channel technique is used. Therefore, in the present embodiment, in order to increase the threshold voltage of the low-breakdown-voltage p-type transistor QLP, the n-type ground plane region GP2 is arranged immediately under the buried insulating layer BOX. However, the n-type ground plane region GP2 is not always necessary. And, in order to increase the threshold voltage, a back bias technique that is application of a voltage with a positive potential to then-type well region NW1 may be used.

That is, as the p-type transistor configuring the first circuit CB10, a transistor with the n-type ground plane region GP2, a transistor without the n-type ground plane region GP2, or a transistor for which the back bias technique has been used may be mixed. Here, it is effective to reduce the impurity concentration of the impurity concentration of the channel formation region CHLP when the threshold voltage is adjusted by the ground plane region GP2 or the back bias technique (in other words, effective to reduce the impurity concentration to be equal to or smaller than $3 \times 10^{17}$ cm$^{-3}$).

It is preferable to configure the p-type transistor configuring the second circuit CB20 from the transistor with the n-type ground plane region GP2 or the transistor without the n-type ground plane region GP2, and not preferable to configure it from the transistor for which the back bias technique has been used. In the transistor for which the back bias technique has been used, it is required to form a power feed region for supplying the voltage with the positive potential to the n-type well region NW1, and this is because an area of the formation region for the second circuit CB20 increases.

Next, a device structure of the high-breakdown-voltage n-type transistor QHN will be explained. In FIG. 4, an element isolating film STI is formed in a main surface SUBa of a support substrate SUB, and the high-breakdown-voltage n-type transistor QHN is formed in the region R4 sectioned by this element isolating film STI. The p-type well region PW3 is formed in the main surface SUBa of the support substrate SUB, and the high-breakdown-voltage n-type transistor QHN is formed inside the p-type well region PW3.

The high-breakdown-voltage n-type transistor QLH has an n-type gate electrode GHN, a gate insulating film GIH, an n-type source region HNS, an n-type drain region HND and a channel formation region CHHN.

The source region HNS, the drain region HND and the channel formation region CHHN are formed inside the well region PW3, and the source region HNS and the drain region HND are arranged on both ends of the gate electrode GHN so as to sandwich the gate electrode GHN therebetween. The channel formation region CHHN is formed between the source region HNS and the drain region HND, and the gate electrode GHN is arranged over the channel formation region CHHN through the gate insulating film GIH. Each of the source region HNS and the drain region HND includes an n-type extension region EN3 and an n-type semiconductor region NR3. The extension region EN3 is positioned between the semiconductor region NR3 and the channel formation region CHHN, and is positioned under a sidewall spacer (sidewall insulating film) SW formed over a sidewall of the gate electrode GHN. A silicide layer SIL is formed in a surface of the semiconductor region NR3 and a surface of the gate electrode GHN.

Next, a device structure of the high-breakdown-voltage p-type transistor QHP will be explained. In FIG. 4, an element isolating film STI is formed in a main surface SUBa of a support substrate SUB, and the high-breakdown-voltage p-type transistor QHP is formed in the region R5 sectioned by this element isolating film STI. The n-type well region NW2 is formed in the main surface SUBa of the support substrate SUB, and the high-breakdown-voltage p-type transistor QHP is formed inside the n-type well region NW2.

The high-breakdown-voltage p-type transistor QHP has a p-type gate electrode GHP, a gate insulating film GIH, a p-type source region HPS, a p-type drain region HPD and a channel formation region CHHP.

The source region HPS, the drain region HPD and the channel formation region CHHP are formed inside the well region NW2, and the source region HPS and the drain region HPD are arranged on both ends of the gate electrode GHP so as to sandwich the gate electrode GHP therebetween. The channel formation region CHHP is formed between the source region HPS and the drain region HPD, and the gate electrode GHP is arranged over the channel formation region CHHP through the gate insulating film GIH. Each of the source region HPS and the drain region HPD includes a p-type extension region EP2 and a p-type semiconductor region PR2. The extension region EP2 is positioned between the semiconductor region PR2 and the channel formation region CHHP, and is positioned under a sidewall spacer (sidewall insulating film) SW formed over a sidewall of the gate electrode GHP. A silicide layer SIL is formed in a surface of the semiconductor region PR2 and a surface of the gate electrode GHP.

While each of the low-breakdown-voltage n-type transistor QLN and the low-breakdown-voltage p-type transistor QLP is the SOTB transistor, each of the high-breakdown-voltage n-type transistor QHN and the high-breakdown-voltage p-type transistor QHP is referred to as a bulk transistor. This is because each of the high-breakdown-voltage n-type transistor QHN and the high-breakdownvoltage p-type transistor QHP is formed in not the semiconductor layer SL in the SOI substrate but the support substrate SUB.

A gate length of each of the high-breakdown-voltage n-type transistor QHN and the high-breakdown-voltage p-type transistor QHP is larger than a gate length of each of the low-breakdown-voltage n-type transistor QLN and the low-breakdown-voltage p-type transistor QLP, and is, for example, 150 nm. A thickness of the gate insulating film GIH of each of the high-breakdown-voltage n-type transistor QHN and the high-breakdown-voltage p-type transistor QHP is larger than a thickness of the gate insulating film GIL of each of the low-breakdown-voltage n-type transistor QLN and the low-breakdown-voltage p-type transistor QLP, and is, for example, 5 to 15 nm.

Next, a device structure of the n-type transistor M20 that is the SOTB transistor will be explained. In FIG. 3, an element isolating film STI is formed in an SOI substrate formed of a support substrate SUB, a buried insulating layer BOX and a semiconductor layer SL. The n-type transistor M20 is formed in the region R3 sectioned by this element isolating film STI.

The n-type transistor M20 has an n-type gate electrode GM, a gate insulating film GIM, an n-type source region MS, an n-type drain region MD and a channel formation region CHM.

The source region MS, the drain region MD and the channel formation region CHM are formed inside the semiconductor layer SL positioned over the buried insulating layer BOX, and the source region MS and the drain region MD are arranged on both ends of the gate electrode GM so as to sandwich the gate electrode GM therebetween. The channel formation region CHM is formed between the source region MS and the drain region MD, and the gate electrode GM is arranged over the channel formation region CHM through the gate insulating film GIM. Each of the source region MS and the drain region MD includes an n-type extension region EN2 and an n-type semiconductor region NR2. The extension region EN2 is positioned between the semiconductor region NR2 and the channel formation region CHM, and positioned under the sidewall spacer (sidewall insulating film) SW formed over a sidewall of the gate electrode GM. A silicide layer SIL is formed in a surface of the semiconductor region NR2 and a surface of the gate electrode GM.

In the region R3, a p-type well PW2 is formed in a main surface SUBa of the p-type support substrate SUB. Further, inside the p-type well region PW2, a p-type ground plane region (semiconductor region) GP1 is formed so as to be in contact with the buried insulating layer BOX. An impurity concentration of the ground plane region GP1 is higher than an impurity concentration of the p-type well region PW2, and the impurity concentration of the p-type well region PW2 is higher than an impurity concentration of the support substrate SUB.

The n-type transistor M20 has the same structure as that of the above-described low-breakdown-voltage n-type transistor QLN. However, an impurity concentration of the channel formation region CHM of the n-type transistor M20 is higher than an impurity concentration of the channel formation region CHLN of the low-breakdown-voltage n-type transistor QLN. The structure is a doped channel structure obtained by ion-implantation of the impurity such as boron (B) to the channel formation region CHM. Incidentally, the impurity concentration of the channel formation region CHM of the n-type transistor M20 is set to $3 \times 10^{18}$ $cm^{-3}$. In this manner, when the impurity concentration of the channel formation region CHM of the n-type transistor M20 is higher than the impurity concentration of the channel formation region CHLN of the low-breakdown-voltage n-type transistor QLN, a leakage current of the n-type transistor M20 can be reduced, and a power consumption of the shift resister formed in the second circuit CB20 shown in FIG. 2 can be reduced.

Here, as a first comparative example, a case in which the n-type transistor M20 of the switch unit CB22 of FIG. 2 is configured of the low-breakdown-voltage n-type transistor QLN having the non-doped structure show in FIG. 3 will be explained. This is because it is usual to configure the second circuit CB20 from the low-breakdown-voltage n-type transistor QLN and the low-breakdown-voltage p-type transistor QLP that are the same as those of the first circuit CB10 since the second circuit CB20 receives an input signal from the first circuit CB10 operating at the first power supply voltage.

In the equivalent circuit diagram shown in FIG. 2, for example, when the power supply to the semiconductor device SD is turned ON or others, signals IN1 and IN2 that are the input signals of the level shifter are unsteady, and both the signals IN1 and IN2 can have a value of "(first power supply voltage)/2", and therefore, both the n-type transistors M22 and M24 are turned ON. Since the p-type transistors M21 and M23 are cross-coupled, and therefore, a voltage of the node C rises up to a second power supply voltage. That is, the second power supply voltage is applied to a drain of the low-breakdown-voltage n-type transistor configuring the n-type transistor M20.

The n-type transistor M20 of the switch unit CB22 is configured of the low-breakdown-voltage n-type transistor QLN having the shorter gate length than that of the high-breakdown-voltage n-type transistor QHN. When a gate voltage of the n-type transistor M20 is equal to or lower than a threshold voltage, a leakage current between the drain and the source that is called subthreshold current is increased by application of a high voltage to the drain. This phenomenon is called DIBL (Drain Induced Barrier Lowering).

On the other hand, in the present first embodiment, while the n-type transistor M20 is configured to have the same structure as that of the low-breakdown-voltage n-type transistor QLN, the impurity concentration of the channel formation region CHM of the n-type transistor M20 is set to be higher than the impurity concentration of the channel formation region CHLN of the low-breakdown-voltage n-type transistor QLN, so that the leakage current of the n-type transistor M20 can be reduced. That is, by the increase in the impurity concentration of the channel formation region CHM, the extension of the depletion layer can be reduced even if the second power supply voltage is applied to the drain, and the influence of the drain electric field on the source can be prevented, and therefore, the leakage current between the drain and the source can be prevented, and the power consumption of the semiconductor device can be achieved.

The n-type transistor M20 can be configured to have the same structure as that of the low-breakdown-voltage n-type transistor QLN so that their gate lengths are equal to each other, and therefore, the area of the level shifter can be reduced, and the high integration of the semiconductor device SD can be achieved.

As different from first and second modification examples described later, it is not required to form the element isolating film STI whose main surface has a level difference inside the formation region for the second circuit CB20, and therefore, the high integration of the semiconductor device SD can be achieved.

First Modification Example

FIG. 5 is a cross-sectional view showing a device structure of a semiconductor device according to a first modification example of the first embodiment. In the first modification example, the structure of the n-type transistor configuring the switch unit CB22 of the second circuit CB20 shown in FIG. 2 is different. The structures of the low-breakdown-voltage n-type transistor QLN, the low-breakdown-voltage p-type transistor QLP, the high-breakdown-voltage n-type transistor QHN and the high-breakdown-voltage p-type transistor QHP are the same as those of the above-described first embodiment. The switch unit CB22 of the second circuit CB20 is configured of an n-type transistor M20a shown in FIG. 5. While the n-type transistor M20 in the above-described first embodiment is configured of the SOTB transistor, the n-type transistor M20a in the first modification example is a bulk transistor, and is formed in the support substrate SUB. Other configurations are the same as those of the n-type transistor M20 in the above-described first embodiment, and are added with the same reference symbols.

The n-type transistor M20a has the n-type gate electrode GM, the gate insulating film GIM, the n-type source region MS, the n-type drain region MD and the channel formation region CHM. The gate electrode GM is formed over a main surface SUBa of the support substrate SUB through the gate insulating film GIM. The n-type source region MS, the n-type drain region MD and the channel formation region CHM are formed inside the support substrate SUB. Each of the source region MS and the drain region MD includes an n-type extension region EN3 and an n-type semiconductor region NR3.

Here, a gate length of the gate electrode GM is equal to a gate length of the gate electrode GLN of the low-breakdown-voltage n-type transistor QLN, and a thickness of the gate insulating film GIM is equal to a thickness of the gate electrode GIL of the low-breakdown-voltage n-type transistor QLN. An impurity concentration of the channel formation region CHM is higher than an impurity concentration of the channel formation region CHLN of the low-breakdown-voltage n-type transistor QLN.

According to the first modification example, not only the effects of the above-described first embodiment but also the following effects can be obtained. That is, heat generated in the n-type transistor M20a can be released through the support substrate SUB, and therefore, heat-release characteristics can be improved.

Second Modification Example

FIG. 6 is a cross-sectional view showing a device structure of a semiconductor device according to a second modification example of the first embodiment. In the second modification example, the structure of the n-type transistor configuring the switch unit CB22 of the second circuit CB20 shown in FIG. 2 is different. The structures of the low-breakdown-voltage n-type transistor QLN, the low-breakdown-voltage p-type transistor QLP, the high-breakdown-voltage n-type transistor QHN and the high-breakdown-voltage p-type transistor QHP are the same as those of the above-described first embodiment. The switch unit CB22 of the second circuit CB20 is configured of an n-type transistor M20b shown in FIG. 6. The n-type transistor M20b in the second modification example is a bulk transistor, and has the same structure as that of the high-breakdown-voltage n-type transistor QHN. The common configurations to those of the above-described first embodiment are added with the same reference symbols.

The n-type transistor M20b has the n-type gate electrode GM, the gate insulating film GIM, the n-type source region MS, the n-type drain region MD and the channel formation region CHM. The gate electrode GM is formed over the main surface SUBa of the support substrate SUB through the gate insulating film GIM. The n-type source region MS, the n-type drain region MD and the channel formation region CHM are formed inside the support substrate SUB. Each of the source region MS and the drain region MD includes an n-type extension region EN3 and an n-type semiconductor region NR3.

Here, the gate length of the gate electrode GM is larger than the gate length of the gate electrode GLN of the low-breakdown-voltage n-type transistor QLN, and therefore, the impurity concentration of the channel formation region CHM can be equal to the impurity concentration of the channel formation region CHLN of the low-breakdown-voltage n-type transistor QLN. Since the gate length of the gate electrode GM is larger, the leakage current of the n-type transistor M20b can be reduced. Since the n-type transistor M20b is the bulk transistor, heat generated in the n-type transistor M20b can be released through the support substrate SUB, and therefore, heat-release characteristics can be improved.

Note that the impurity concentration of the channel formation region CHM may be higher than the impurity concentration of the channel formation region CHLN of the low-breakdown-voltage n-type transistor QLN, so that the leakage current can be further reduced.

Third Modification Example

FIG. 7 is an equivalent circuit diagram of a semiconductor device according to a third modification example of the first embodiment. In the semiconductor device in the third modification example, a circuit configuration of a level shift unit CB23 is different from a circuit configuration of the level shift unit CB21 in the first embodiment.

The level shift unit CB23 in the third modification example has p-type transistors M21, M25, M23 and M26 and n-type transistors M22 and M24. The p-type transistor M25 is connected between the p-type transistor M21 and a node D, and has a gate connected to a node A. The p-type transistor M26 is connected between the p-type transistor M23 and a node E, and has a gate connected to a node B.

FIG. 8 is a time chart of the equivalent circuit diagram shown in FIG. 2. FIG. 8 shows an operational transition example of each of the nodes A, B, D and E of the second circuit CB20 that is the level shifter, the p-type transistors M21 and M23, and the n-type transistors M22 and M24.

As shown in FIG. 8, after the input signal IN1 that is the input signal of the level shifter transits from Low to High, an operational transition of the p-type transistor M21 is later than an operational transition of the n-type transistor M22, and therefore, the ON states of the n-type transistor M22 and the p-type transistor M21 occur at the same time. During this ON state in both of them, a potential of the node D becomes a potential of a resistance division point (Low') of an ON resistance of the p-type transistor M21 and an ON resistance of the n-type transistor M22. Although it is of course necessary to increase the ON resistance of the n-type transistor M22, that is, increase the driving performance of the n-type transistor M22, it takes large transition time, and therefore, a through current flows during the transition time.

When the potential of the node D becomes Low', the p-type transistor M23 is turned ON, a current flows into the node E surrounded by the high resistances, so that the potential becomes High, and therefore, the p-type transistor M21 can be turned OFF. In this manner, the potential of the node D becomes completely Low, and the output becomes steady.

On the other hand, in the case of the equivalent circuit diagram of FIG. 7, when the signal IN1 transits from Low to High, the p-type transistor M25 is turned OFF to become a high resistance, and charges of the node D rapidly flow out through the n-type transistor M22, so that the output rapidly becomes steady at Low. Therefore, the time needed for the steady output is short, and high-speed operation is possible. And, the through current can be lower than that of the second comparative example, and the power consumption can be also lower.

Second Embodiment

FIG. 9 is a block diagram of a semiconductor device of a second embodiment. FIG. 10 is a diagram showing a rising sequence of a power supply voltage in the semiconductor device of the second embodiment. The semiconductor device SD1 of the second embodiment has not only the first circuit CB10, the second circuit CB20 and the third circuit CB30 but also a fourth circuit CB40 and a power supply circuit PC.

Each of the fourth circuit CB40 and the power supply circuit PC is a logic circuit driven at an external power supply voltage supplied from outside to the semiconductor device SD1. The external power supply voltage is, for example, 3.3 V. Each of the fourth circuit CB40 and the power supply circuit PC is connected to a third power supply line Vcc. The power supply circuit PC is a circuit that receives the external power supply voltage and generates a first power supply line VL and a second power supply line VH. At the time of, for example, starting up of the semiconductor device SD1, a potential of the third power supply line Vcc reaches the steady state first as shown in FIG. 10, and then, a potential of the second power supply line VH and a potential of the first power supply line VL become in the steady state in this order.

In the present second embodiment, the gate input signal of the n-type transistor of the switch unit CB22 of the second circuit CB20 is taken from the fourth circuit CB40 driven at the external power supply voltage. The n-type transistor of the switch unit CB22 is the same as that of the above-described first embodiment. In the example of the above-described first embodiment, the n-type transistor of the switch unit CB22 is controlled by the signal from the third circuit CB30, and therefore, the through current undesirably flows in the second circuit CB20 during an unsteady state 1 in which the second power supply line VH is in the steady state. On the other hand, in the present second embodiment, the gate of the n-type transistor of the switch unit CB22 is connected to the fourth circuit CB40 so that the n-type transistor of the switch unit CB22 is controlled by the signal from the fourth circuit CB40 driven at the external power supply voltage, and therefore, the n-type transistor of the switch unit CB22 can be turned OFF first. Therefore, the through current flowing in the second circuit CB20 during the unsteady states 1 and 2 in FIG. 10 can be prevented.

In the present second embodiment, note that the external power supply voltage is input to the gate of the n-type transistor of the switch unit CB22, and therefore, the switch unit CB22 is preferably configured of the n-type transistor M20b of the above-described second modification example.

In the foregoing, the invention made by the present inventors has been concretely described on the basis of the embodiments. However, it is needless to say that the present invention is not limited to the foregoing embodiments, and various modifications and alterations can be made within the scope of the present invention.

For example, in the above-described first and second embodiments, the third circuit CB30 is not always necessary. And, the second circuit CB20 has been explained in the example of the level shifter. However, other logic circuits may be also applicable.

The above-described first embodiment may be configured so that the impurity concentration of the channel formation region CHM of the n-type transistor M20 configuring the switch unit CB22 is equal to the impurity concentration of the channel formation region CHLN of the low-breakdown-voltage n-type transistor QLN and so that the gate length of the n-type transistor M20 is larger than the gate length of the low-breakdown-voltage n-type transistor QLN. By the large gate length of the n-type transistor M20, even in the low impurity concentration of the channel formation region CHM, the leakage current of the n-type transistor M20 caused by the DIBL can be reduced. Since it is not required to form the element isolating film STI whose main surface has a level difference inside the formation region of the second circuit CB20 as different from the first and second modification examples, the high integration of the semiconductor device can be achieved.

What is claimed is:

1. A semiconductor device comprising:
a first logic circuit connected between a first power supply line and a first ground line;
a second logic circuit connected to a second power supply line, the second logic circuit being configured to receive an input signal from the first logic circuit;
a switch element connected between the second logic circuit and a second ground line;
a first transistor configuring the first logic circuit; and
a second transistor configuring the switch element,
wherein the first transistor includes:
  a support substrate;
  a first semiconductor layer arranged over the support substrate through a first insulating layer;
  a first source region, a first drain region and a first channel formation region formed inside the first semiconductor layer; and
  a first gate electrode arranged over the first channel formation region through a first gate insulating film,
the second transistor includes:
  the support substrate, a second source region and a second drain region;
  a second channel formation region arranged between the second source region and the second drain region; and
  a second gate electrode arranged over the second channel formation region through a second gate insulating film, and
an impurity concentration of the second channel formation region is higher than an impurity concentration of the first channel formation region.

2. The semiconductor device according to claim 1, wherein a second power supply voltage supplied to the second power supply line is higher than a first power supply voltage supplied to the first power supply line.

3. The semiconductor device according to claim 2,
wherein the second source region, the second drain region and the second channel formation region are formed inside the support substrate.

4. The semiconductor device according to claim 3,
wherein a thickness of the second gate insulating film is equal to a thickness of the first gate insulating film.

5. The semiconductor device according to claim 3,
wherein a length of the second gate electrode is equal to a length of the first gate electrode.

6. The semiconductor device according to claim 2,
wherein the first and second transistors are a first conductive type,
wherein the first and second source regions are the first conductive type, and the first and second drain regions are the first conductive type,
wherein the second transistor includes a second semiconductor layer arranged over the support substrate through a second insulating layer, and
wherein the second source region, the second drain region and the second channel formation region are formed inside the second semiconductor layer.

7. The semiconductor device according to claim 6,
wherein a thickness of the second gate insulating film is equal to a thickness of the first gate insulating film.

8. The semiconductor device according to claim 6,
wherein a length of the second gate electrode is equal to a length of the first gate electrode.

9. The semiconductor device according to claim 6 further comprising:
a third transistor of the first conductive type configuring the second logic circuit,
wherein the third transistor includes:
  the support substrate;
  a third semiconductor layer arranged over the support substrate through a third insulating layer;
  a third source region of the first conductive type, a third drain region of the first conductive type and a third channel formation region formed inside the third semiconductor layer; and
  a third gate electrode arranged over the third channel formation region through a third gate insulating film, and
an impurity concentration of the third channel formation region is equal to the impurity concentration of the first channel formation region.

10. The semiconductor device according to claim 6 further comprising:
a third logic circuit connected to the second power supply line, the third logic circuit being configured to receive an input signal from the second logic circuit; and
a fourth transistor of the first conductive type configuring the third logic circuit,
wherein the fourth transistor includes:
  the support substrate;
  a fourth source region of the first conductive type, a fourth drain region of the first conductive type and a fourth channel formation region formed inside the support substrate; and
  a fourth gate electrode arranged over the fourth channel formation region through a fourth gate insulating film.

11. The semiconductor device according to claim 10,
wherein a thickness of the fourth gate insulating film is larger than a thickness of the first gate insulating film.

12. The semiconductor device according to claim 10,
wherein a length of the fourth gate electrode is larger than a length of the first gate electrode.

13. The semiconductor device according to claim 6,
wherein the second logic circuit has a first circuit and a second circuit connected in parallel between the second power supply line and the switch element,
the first circuit includes a fifth transistor of a second conductive type that is opposite to the first conductive type and a sixth transistor of the first conductive type,
the first circuit is configured so that a source/drain path of the fifth transistor connected to the second power supply line and a source/drain path of the sixth transistor are connected in series,
the first circuit has a first node at a gate of the sixth transistor and a second node between the source/drain path of the fifth transistor and the source/drain path of the sixth transistor,
the second circuit includes a seventh transistor of the second conductive type and an eighth transistor of the first conductive type,
the second circuit is configured so that a source/drain path of the seventh transistor connected to the second power supply line and a source/drain path of the eighth transistor are connected in series,
the second circuit has a third node at a gate of the eighth transistor and a fourth node between the source/drain path of the seventh transistor and the source/drain path of the eighth transistor,
a gate of the fifth transistor is connected to the fourth node, and
a gate of the seventh transistor is connected to the second node.

14. The semiconductor device according to claim 13,
wherein the second logic circuit further has:
  a ninth transistor of the second conductive type formed between the source/drain path of the fifth transistor and the second node; and
  a tenth transistor of the second conductive type formed between the source/drain path of the seventh transistor and the fourth node,
a gate of the ninth transistor is connected to the first node, and
a gate of the tenth transistor is connected to the third node.

15. A semiconductor device comprising:
a first logic circuit connected between a first power supply line and a first ground line;
a second logic circuit connected to a second power supply line, the second logic circuit being configured to receive an input signal from the first logic circuit;
a switch element connected between the second logic circuit and a second ground line;
a first transistor of a first conductive type configuring the first logic circuit; and
a second transistor of the first conductive type configuring the switch element,
wherein the first transistor includes:
  a support substrate;
  a first semiconductor layer arranged over the support substrate through a first insulating layer;
  a first source region of the first conductive type, a first drain region of the first conductive type and a first channel formation region formed inside the first semiconductor layer; and
  a first gate electrode arranged over the first channel formation region through a first gate insulating film, the second transistor includes:
  the support substrate;
  a second semiconductor layer arranged over the support substrate through a second insulating layer;
  a second source region of the first conductive type, a second drain region of the first conductive type and a second channel formation region formed inside the second semiconductor layer; and
  a second gate electrode arranged over the second channel formation region through a second gate insulating film,
a second power supply voltage supplied to the second power supply line is higher than a first power supply voltage supplied to the first power supply line, and
a length of the second gate electrode is larger than a length of the first gate electrode.

16. The semiconductor device according to claim 15, wherein a thickness of the second gate insulating film is equal to a thickness of the first gate insulating film.

17. The semiconductor device according to claim 15, wherein an impurity concentration of the second channel formation region is equal to an impurity concentration of the first channel formation region.

18. A semiconductor device comprising:
a first logic circuit connected between a first power supply line and a first ground line;
a second logic circuit connected to a second power supply line, the second logic circuit being configured to receive an input signal from the first logic circuit;
a switch element connected between the second logic circuit and a second ground line;
a first transistor of a first conductive type configuring the first logic circuit; and
a second transistor of the first conductive type configuring the switch element,
wherein the first transistor includes:
  a support substrate;
  a first semiconductor layer arranged over the support substrate through a first insulating layer;
  a first source region of the first conductive type, a first drain region of the first conductive type and a first channel formation region formed inside the first semiconductor layer; and
  a first gate electrode arranged over the first channel formation region through a first gate insulating film,
the second transistor includes:
  the support substrate;
  a second source region of the first conductive type, a second drain region of the first conductive type and a second channel formation region formed inside the support substrate; and
  a second gate electrode arranged over the second channel formation region through a second gate insulating film,
a second power supply voltage supplied to the second power supply line is higher than a first power supply voltage supplied to the first power supply line, and
a length of the second gate electrode is larger than a length of the first gate electrode.

19. The semiconductor device according to claim 18, wherein a thickness of the second gate insulating film is larger than a thickness of the first gate insulating film.

20. The semiconductor device according to claim 19 further comprising:
a fourth logic circuit connected to a third power supply line; and
a power supply circuit connected to the third power supply line, the power supply circuit being configured to supply the first power supply voltage to the first power supply line and the second power supply voltage to the second power supply line, respectively,
wherein the second gate electrode of the second transistor is connected to the fourth logic circuit.

* * * * *